(12) United States Patent
Liu et al.

(10) Patent No.: US 8,334,859 B2
(45) Date of Patent: Dec. 18, 2012

(54) ELECTROLUMINESCENT DISPLAY AND METHOD OF DRIVING SAME

(75) Inventors: Chih-Chi Liu, Hsinchu (TW); Tze-Chien Tsai, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 141 days.

(21) Appl. No.: 13/073,387

(22) Filed: Mar. 28, 2011

(65) Prior Publication Data

US 2012/0249602 A1 Oct. 4, 2012

(51) Int. Cl.
*G09G 5/00* (2006.01)
*G06F 3/038* (2006.01)

(52) U.S. Cl. ............. 345/204; 345/76; 345/79; 345/82; 345/690; 315/169.3

(58) Field of Classification Search .................... 345/39, 345/76, 79, 82–83, 204, 690; 315/169.3
See application file for complete search history.

(56) References Cited

U.S. PATENT DOCUMENTS

| | | | |
|---|---|---|---|
| 2002/0070909 A1* | 6/2002 | Asano et al. ............ | 345/76 |
| 2006/0038953 A1* | 2/2006 | Moriya ................. | 349/144 |
| 2006/0132668 A1* | 6/2006 | Park et al. ............. | 349/48 |
| 2007/0139437 A1 | 6/2007 | Boroson et al. | |
| 2008/0165171 A1 | 7/2008 | Chiou | |

FOREIGN PATENT DOCUMENTS

| | | |
|---|---|---|
| EP | 01755104 | 2/2007 |
| JP | 2007164100 | 6/2007 |
| JP | 2008058572 | 3/2008 |

* cited by examiner

*Primary Examiner* — Lun-Yi Lao
*Assistant Examiner* — Insa Sadio
(74) *Attorney, Agent, or Firm* — Morris Manning & Martin LLP; Tim Tingkang Xia, Esq.

(57) ABSTRACT

An electroluminescent (EL) display device has pixels spatially arranged in a matrix, each pixel having first, second, third and fourth EL elements, gate lines each coupled to a respective row of pixels, first data lines each coupled to the first EL elements of a respective column of pixels, second data lines each coupled to the second EL elements of a respective column of pixels, first switches each coupled to a respective third EL element, second switches each coupled to a respective fourth EL element, a switch control line coupled to the first and second switches for providing a switching control signal to set the first and second switches to be in an ON state or an OFF state, and third data lines each coupled to the first and second switches corresponding to a respective column of pixels for transmitting a data signal.

20 Claims, 9 Drawing Sheets

ELECTROLUMINESCENT DISPLAY AND METHOD OF DRIVING SAME

FIELD OF THE INVENTION

The present invention relates generally to an electroluminescent (EL) display, and more particularly to an EL display device with each pixel having four light emitting elements and methods of driving same.

BACKGROUND OF THE INVENTION

Display devices employing electroluminescent display elements, such as organic light emitting diodes (OLEDs), have become a popular choice among flat panel displays. EL displays are used as television screens, computer monitors, portable electronic systems such as mobile phones and personal digital assistants (PDAs). An OLED is a light emitting diode (LED) in which the emissive electroluminescent (EL) layer is a film of an organic material which emit light in response to an electric current. This layer of organic material is situated between two electrodes. Generally, at least one of these electrodes is transparent. An EL display functions without a backlight. Thus, it can display deep black levels and can also be thinner and lighter than other flat panel displays such as liquid crystal displays (LCDs).

An EL display panel may comprise a plurality of pixels spatially arranged in a form of a matrix with a plurality of rows and a plurality of columns in a display area. For a color EL display panel, each pixel may comprise several OLEDs each emitting light of a different color in the visible spectrum from which various colors may be composed. FIG. 8(a) shows schematically a typical pixel 810 for a color EL display panel that has three light emitting elements 812, each emitting red (R), green (G), and blue (B) light, respectively. The traditional organic material used for blue OLEDs has a relatively low luminous efficiency. Consequently, a relatively large electrical current is required in order for a blue OLED to emit light with a certain intensity. Operating an OLED at the large electrical currents would have the adverse effect of shortening the lifetime of the OLED.

Recently, a new material of emitting yellow-green light with a higher luminous efficiency has been reported. Table 1 summarizes the luminous efficiencies for four EL materials used in color EL displays. In this table, R stands for an EL material for red OLEDs, G stands for an EL material for green OLEDs, B2 stands for a traditional EL material for blue OLEDs, and B1 stands for a new EL material for yellow-green OLEDs. The 1931 CIE color space (x, y) parameters associated with the light emitted by these materials are also listed. As can be seen in Table 1, the new EL material B1 for yellow-green OLEDs has a luminous efficiency that is more than four times that of the traditional EL material B2 for blue OLEDs. The new material B1 may be used in addition to the traditional material B2 for producing blue light in a color EL display panel.

TABLE 1 the luminous efficiencies for four EL materials used in color EL displays

| Material | 1931 CIE (x, y) | Luminous Efficiency (cd/A) |
| --- | --- | --- |
| R | (0.67, 0.33) | 35 |
| G | (0.21, 0.70) | 90 |
| B2 | (0.14, 0.06) | 5 |
| B1 | (0.114, 0.148) | 22.5 |

FIG. 8(b) shows a pixel 820 for a color EL display panel that includes four light emitting elements 822, one emitting red light (R), one emitting green light (G), one emitting yellow-green light (B1), and one emitting blue light (B2). The four light emitting elements 822 are spatially arranged as a 2×2 sub-array.

FIG. 9 shows schematically an EL display panel 900 that has such a pixel arrangement as FIG. 8(b). The EL display panel 900 includes a plurality of pixels 910 spatially arranged in a form of a matrix with a plurality of rows and a plurality of columns. Each pixel 910 includes four light emitting elements 912 labeled as R, G, B1, and B2, respectively, according to the color of the light emitted by the elements. The EL display panel 900 includes a plurality of gate lines GAn and GBn (n=1,2, . . . ) and a plurality of data lines SAn and SBn (n=1,2, . . . ). Each gate line GAn is coupled to the R and B1 elements of a respective row of pixels, and each gate line GBn is coupled to the G and B2 elements of a respective row of pixels. A gate driver outputs scanning signals to the plurality of gate lines GAn and GBn sequentially so that the elements in the pixels are sequentially driven in a row-by-row fashion. Each data line SAn is coupled to the R and G elements of a respective column of pixels, and each data line SBn is coupled to the B1 and B2 elements of a respective column of pixels. Therefore, in this configuration, two gate lines GAn and GBn are required for each row of pixels and two data lines SAn and SBn are required for each column of pixels. For example, for a display panel with a 240×320 resolution, there would be 480 total data lines and 640 total gate lines. In comparison, for a display with the same resolution but comprising RGB pixels as shown in FIG. 8(a), the required data lines and gate lines would be 720 and 320, respectively. Therefore, the display panel 900 requires twice the number of gate lines as that required in a display panel with the same resolution comprising RGB pixels. Consequently, the scan driver is more complicated which in turn results in higher cost.

Therefore, a heretofore unaddressed need exists in the art to address the aforementioned deficiencies and inadequacies.

SUMMARY OF THE INVENTION

The present invention, in one aspect, relates to an electroluminescent (EL) display device. In one embodiment, the EL display device includes a plurality of pixels spatially arranged in a form of a matrix with a plurality of rows and a plurality of columns, each pixel has a first EL element operably emitting light of a first color, a second EL element operably emitting light of a second color, a third EL element operably emitting light of a third color, and a fourth EL element operably emitting light of a fourth color. In one embodiment, the first color is a red color, the second color is a green color, the third color is a blue color and the fourth color is a yellow-green color. In one embodiment, the first EL element, the second EL element, the third EL element and the fourth EL element of each pixel are spatially arranged as a 2×2 sub-array.

The EL display device also includes a plurality of gate lines. Each gate line is coupled to a respective row of pixels.

The EL display device further includes a plurality of first data lines, a plurality of second data lines, and a plurality of third data lines. Each first data line is coupled to the first EL elements of a respective column of pixels. Each second data line is coupled to the second EL elements of a respective column of pixels.

Additionally, the EL display device includes a plurality of first switches, a plurality of second switches, and a plurality of switch control lines. Each first switch coupled to a respective third EL element. Each second switch coupled to a respective fourth EL element. The first switches coupled to the third EL elements of a respective column of pixels are configured to be cooperatively in an ON state or an OFF state. The second switches coupled to the fourth EL elements of a respective column of pixels are configured to be cooperatively in an ON state or an OFF state. Each switch control line is coupled to the first switches and the second switches corresponding to a respective column of pixels for transmitting a switching control signal to set the first switches and the second switches to be in the ON state or the OFF state, such that when the first switches are cooperatively in the ON state, the second switches are cooperatively in the OFF state, and vice versus.

Further, each third data line coupled to the first switches and the second switches corresponding to a respective column of pixels for transmitting a data signal, such that when the first switches are cooperatively in the ON state, the data signal is provided to the third EL elements of the respective column of pixels, and when the second switches are cooperatively in the ON state, the data signal is provided to the fourth EL elements of the respective column of pixels.

In one embodiment, the EL display device may also have an image processor for processing an image to be displayed according to the pixel matrix of the EL display device such that the processed image has a plurality of pixel data signals, each pixel data signal being associated with a respective pixel and having a first sub-pixel data signal, a second sub-pixel data signal, a third sub-pixel data signal and a fourth sub-pixel data signal indicating intensities for the first EL element, the second EL element, the third EL element and the fourth EL element, respectively, of the respective pixel, and a selector configured to compare the third sub-pixel data signal and the fourth sub-pixel data signal of each pixel, to assign a logic value of 1 to the corresponding pixel if the third sub-pixel data signal is greater than or equal to the fourth sub-pixel data signal, or a logic value of 0 to the corresponding pixel if the third sub-pixel data signal is less than the fourth sub-pixel data signal, and to count the number of the logic value of 1, NB1, and the number of the logic value of 0, NB2, of each column of pixels.

In one embodiment, the switching control signal for a respective column of pixels is configured to set the first switches and the second switches corresponding to the respective column of pixels in the ON state and the OFF state, respectively, if NB1≧NB2 for the respective column of pixels, and the first switches and the second switches in the OFF state and the ON state, respectively, if NB1<NB2 for the respective column of pixels.

In one embodiment, the switching control signal for a respective column of pixels is characterized with a waveform having a low voltage and a high voltage. When the switching control signal for the respective column of pixels has one of the low voltage and the high voltage, the first switches and the second switches corresponding to the respective column of pixels are set in the ON state and the OFF state, respectively. When the switching control signal for the respective column of pixels has the other of the low voltage and the high voltage, the first switches and the second switches corresponding to the respective column of pixels are set in the OFF state and the ON state, respectively. In one embodiment, each of the plurality of first switches comprises one of an N-type thin film transistor (TFT) and a P-type TFT, and each of the plurality of second switches comprises the other of the N-type TFT and the P-type TFT, wherein each of the N-type TFT and the P-type TFT has a gate, a source and a drain. The gate, source and drain of each N-type TFT are respectively coupled to a corresponding switching control line, a corresponding third data line and one of the third EL element and the fourth EL element of a corresponding pixel. The gate, source and drain of each P-type TFT are respectively coupled to the corresponding switching control line, the corresponding third data line and the other of the third EL element and the fourth EL element of the corresponding pixel.

In another aspect, the present invention relates to a method of driving the EL display device disclosed above. In one embodiment, the method includes the steps of processing an image to be displayed according to the pixel matrix of the EL display device such that the processed image has a plurality of pixel data signals, each pixel data signal being associated with a respective pixel and having a first sub-pixel data signal, a second sub-pixel data signal, a third sub-pixel data signal and a fourth sub-pixel data signal indicating intensities for the first EL element, the second EL element, the third EL element and the fourth EL element, respectively, of the respective pixel, and comparing the third sub-pixel data signal and the fourth sub-pixel data signal of each pixel, assigning a logic value of 1 to the corresponding pixel if the third sub-pixel data signal is greater than or equal to the fourth sub-pixel data signal, or a logic value of 0 to the corresponding pixel if the third sub-pixel data signal is less than the fourth sub-pixel data signal, counting the number of the logic value of 1, NB1, and the number of the logic value of 0, NB2, of each column of pixels, and configuring the switching control signal for a respective column of pixels so as to set the first switches and the second switches corresponding to the respective column of pixels in the ON state and the OFF state, respectively, if NB1≧NB2 for the respective column of pixels, and the first switches and the second switches in the OFF state and the ON state, respectively, if NB1<NB2 for the respective column of pixels.

In yet another aspect, the present invention relates to an EL display device. In one embodiment, the EL display device has a plurality of pixels spatially arranged in a form of a matrix with a plurality of rows and a plurality of columns, each pixel comprising a first EL element operably emitting light of a first color, a second EL element operably emitting light of a second color, a third EL element operably emitting light of a third color, and a fourth EL element operably emitting light of a fourth color, a plurality of gate lines, each gate line coupled to a respective row of pixels, a plurality of first data lines, each first data line coupled to the first EL elements of a respective column of pixels, a plurality of second data lines, each second data line coupled to the second EL elements of a respective column of pixels, a plurality of first switches, each first switch coupled to a respective third EL element, wherein the plurality of first switches are configured to be cooperatively in an ON state or an OFF state, a plurality of second switches, each second switch coupled to a respective fourth EL element, wherein the plurality of second switches are configured to be cooperatively in an ON state or an OFF state, a switch control line coupled to the plurality of first switches and the plurality of second switches for providing a switching control signal to set the first switches and the second switches to be in the ON state or the OFF state, such that when the plurality of first switches are cooperatively in the ON state, the plurality of second switches are cooperatively in the OFF state, and vice versus, and a plurality of third data lines, each third data line coupled to the first switches and the second switches corresponding to a respective column of pixels for transmitting a data signal, such that when the first switches are cooperatively in the ON state, the data signal is provided to the third EL elements of the respective column of pixels, and when the second switches are cooperatively in the ON state, the data signal is provided to the fourth EL elements of the respective column of pixels.

In one embodiment, the EL display device further has an image processor for processing an image to be displayed according to the pixel matrix of the EL display device such that the processed image has a plurality of pixel data signals, each pixel data signal being associated with a respective pixel and having a first sub-pixel data signal, a second sub-pixel data signal, a third sub-pixel data signal and a fourth sub-pixel data signal indicating intensities for the first EL element, the second EL element, the third EL element and the fourth EL element, respectively, of the respective pixel, and a selector configured to compare the third sub-pixel data signal and the fourth sub-pixel data signal of each pixel, to assign a logic value of 1 to the corresponding pixel if the third sub-pixel data signal is greater than or equal to the fourth sub-pixel data signal, or a logic value of 0 to the corresponding pixel if the third sub-pixel data signal is less than the fourth sub-pixel data signal, and to count the number of the logic value of 1, NB1, and the number of the logic value of 0, NB2, of the plurality of pixels.

In one embodiment, the switching control signal is configured to set the plurality of first switches in the ON state and the plurality of second switches in the OFF state, respectively, if NB1≧NB2, and the plurality of first switches in the OFF state and the plurality of second switches in the ON state, respectively, if NB1<NB2.

In one embodiment, the switching control signal is characterized with a waveform having a low voltage and a high voltage. When the switching control signal has one of the low voltage and the high voltage, the plurality of first switches and the plurality of second switches are set in the ON state and the OFF state, respectively. When the switching control signal has the other of the low voltage and the high voltage, the plurality of first switches and the plurality of second switches are set in the OFF state and the ON state, respectively.

In one embodiment, each of the plurality of first switches comprises one of an N-type TFT and a P-type TFT, and each of the plurality of second switches comprises the other of the N-type TFT and the P-type TFT, wherein each of the N-type TFT and the P-type TFT has a gate, a source and a drain. The gate, source and drain of each N-type TFT are respectively coupled to the switching control line, a corresponding third data line and one of the third EL element and the fourth EL element of a corresponding pixel. The gate, source and drain of each P-type TFT are respectively coupled to the switching control line, the corresponding third data line and the other of the third EL element and the fourth EL element of the corresponding pixel.

In one embodiment, the first color is a red color, the second color is a green color, the third color is a blue color and the fourth color is a yellow-green color. In one embodiment, the first EL element, the second EL element, the third EL element and the fourth EL element of each pixel are spatially arranged as a 2×2 sub-array.

In a further aspect, the present invention relates to a method of driving the EL display device. In one embodiment, the method has the steps of processing an image to be displayed according to the pixel matrix of the EL display device such that the processed image has a plurality of pixel data signals, each pixel data signal being associated with a respective pixel and having a first sub-pixel data signal, a second sub-pixel data signal, a third sub-pixel data signal and a fourth sub-pixel data signal indicating intensities for the first EL element, the second EL element, the third EL element and the fourth EL element, respectively, of the respective pixel, comparing the third sub-pixel data signal and the fourth sub-pixel data signal of each pixel, assigning a logic value of 1 to the corresponding pixel if the third sub-pixel data signal is greater than or equal to the fourth sub-pixel data signal, or a logic value of 0 to the corresponding pixel if the third sub-pixel data signal is less than the fourth sub-pixel data signal, counting the number of the logic value of 1, NB1, and the number of the logic value of 0, NB2, of the plurality of pixels, and configuring the switching control signal so as to set the plurality of first switches in the ON state and the plurality of second switches in the OFF state, respectively, if NB1≧NB2, and the plurality of first switches in the OFF state and the plurality of second switches in the ON state, respectively, if NB1<NB2.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
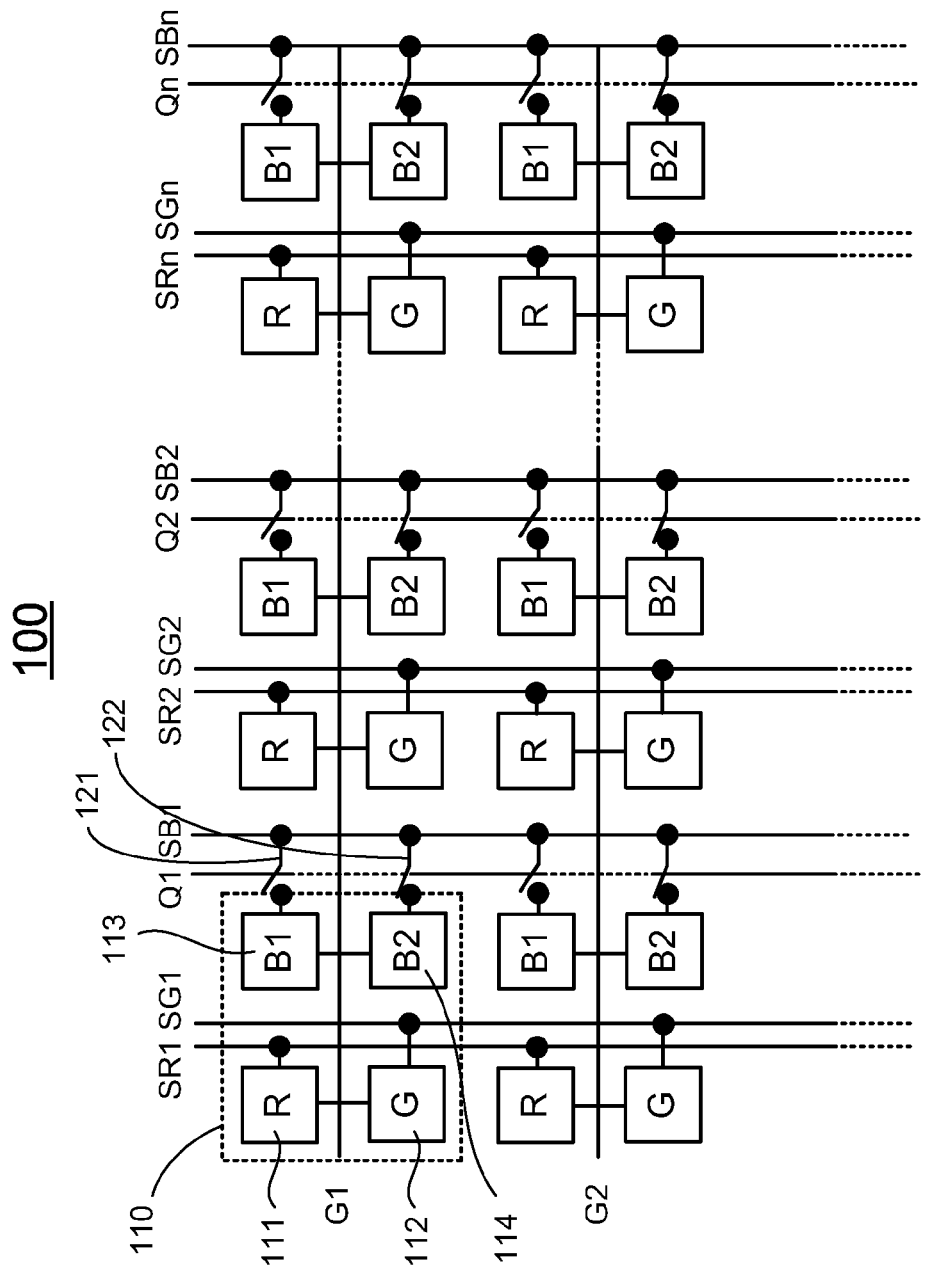
FIG. 1 shows schematically an electroluminescent (EL) display device according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used.

Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "having," "containing," "involving," and the like are to be understood to be open-ended, i.e., to mean including but not limited to.

The description will be made as to the embodiments of the present invention in conjunction with the accompanying drawings in FIGS. 1-7. In accordance with the purposes of this invention, as embodied and broadly described herein, this invention, in one aspect, relates to an EL display device with each pixel having four light emitting elements and a method of driving the same.

Referring to FIG. 1, an EL display device 100 is schematically shown according to one embodiment of the present invention. The EL display device 100 includes a plurality of pixels 110 spatially arranged in a form of a matrix with a plurality of rows and a plurality of columns. Each pixel 110 has four light emitting elements 111-114 spatially arranged as a 2×2 sub-pixel array. The four light emitting elements 111-114 in one embodiment correspond to a first EL element 111 operably emitting light of a first color, a second EL element 112 operably emitting light of a second color, a third EL element 113 operably emitting light of a third color, and a fourth EL element 114 operably emitting light of a fourth color. The first, second and third colors are corresponding to red (R), green (G) and yellow-green (B1) colors, respectively, while the fourth color in one embodiment is corresponding to a blue (B2) color. Each of four light emitting elements 111-114 is formed of a different EL material. In one embodiment, the EL material forming the light emitting element (B1) 113 has a higher luminous efficiency than that of the EL material in the light emitting element (B2) 114.

Figure 9:
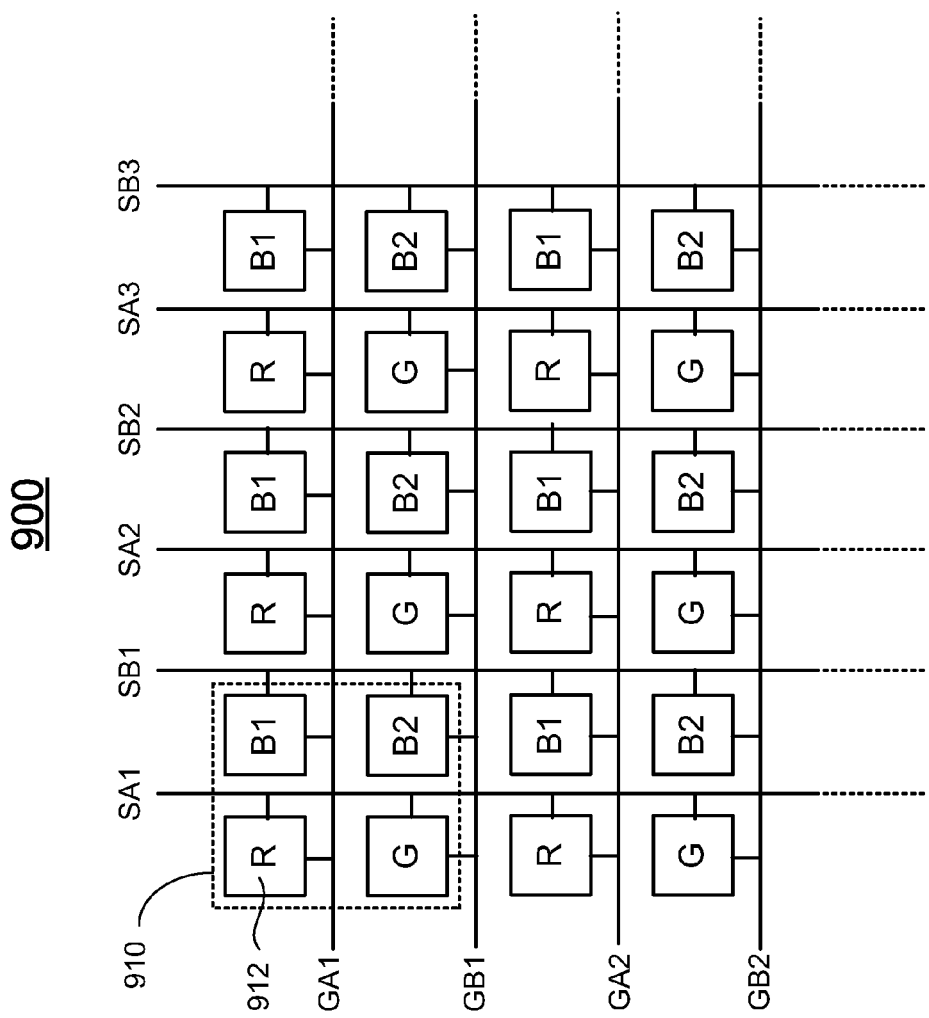
FIG. 9 shows schematically a conventional EL display device.

The EL display device 100 also includes a plurality of gate lines, {Gj}, j=1, 2, 3, . . . , M, M being a positive integer and the row number of the pixel matrix. Each gate line Gj is coupled to the four light emitting elements 111-114 of a respective row of pixels 110. In this arrangement, only one gate line is required for each row of pixels, which substantially reduces the number of the gate lines required for each row of pixels in a conventional EL display device 900 shown in FIG. 9. In operation, a plurality of scanning signals generated from a gate driver (not shown) is respectively applied the plurality of gate lines {Gj} for sequentially driving the pixels in a row-by-row fashion.

The EL display device 100 further includes a plurality of first data lines {SRk}, k=1, 2, 3, . . . , N, N being a positive integer and the column number of the pixel matrix, a plurality of second data lines {SGk}, and a plurality of third data lines {SBk}. Each first data line SRk is coupled to the first EL elements (R) 111 of a respective column of pixels. Each second data line SGk is coupled to the second EL elements 112 of a respective column of pixels. Each third data line SBk is coupled to the third EL elements (B1) 113 and the fourth EL elements (B2) 114 of a respective column of pixels.

The EL display device 100 also includes a plurality of first switches 121, a plurality of second switches 122, and a plurality of switch control lines {Qk}.

As shown in FIG. 1, each first switch 121 is coupled to a respective third EL element (B1) 113, while each second switch 122 is coupled to a respective fourth EL element (B2) 114. In this exemplary embodiment, the first switches 121 coupled to the third EL elements (B1) 113 of a respective column of pixels are configured to be cooperatively in an ON state or an OFF state. The second switches 122 coupled to the fourth EL elements (B2) 114 of a respective column of pixels are configured to be cooperatively in an ON state or an OFF state. Each switch control line Qk is coupled to the first switches 121 and the second switches 122 corresponding to a respective column of pixels for transmitting a switching control signal to set the first switches 121 and the second switches 122 to be in the ON state or the OFF state, such that when the first switches 121 are cooperatively in the ON state, the second switches 122 are cooperatively in the OFF state, and vice versus.

Further, each third data line SBk is coupled to the first switches 121 and the second switches 122 corresponding to a respective column of pixels for transmitting a data signal, such that when the first switches 121 are cooperatively in the ON state, the data signal is provided to the third EL elements 113 of the respective column of pixels, and when the second switches 122 are cooperatively in the ON state, the data signal is provided to the fourth EL elements 114 of the respective column of pixels.

According to this embodiment shown in FIG. 1, only three data lines SRk, SGk and SBk are required for each column of pixels, same as in a conventional color EL display device with each pixel having three light emitting elements. Only one of the two light emitting elements B1 and B2 will emit light at a given time.

The plurality of first data lines {SRk}, the plurality of second data lines {SGk}, and the plurality of third data liens {SBk} are coupled to a source driver (not shown) that outputs pixel data signals of an image to be displayed on the display panel 100.

Figure 2:
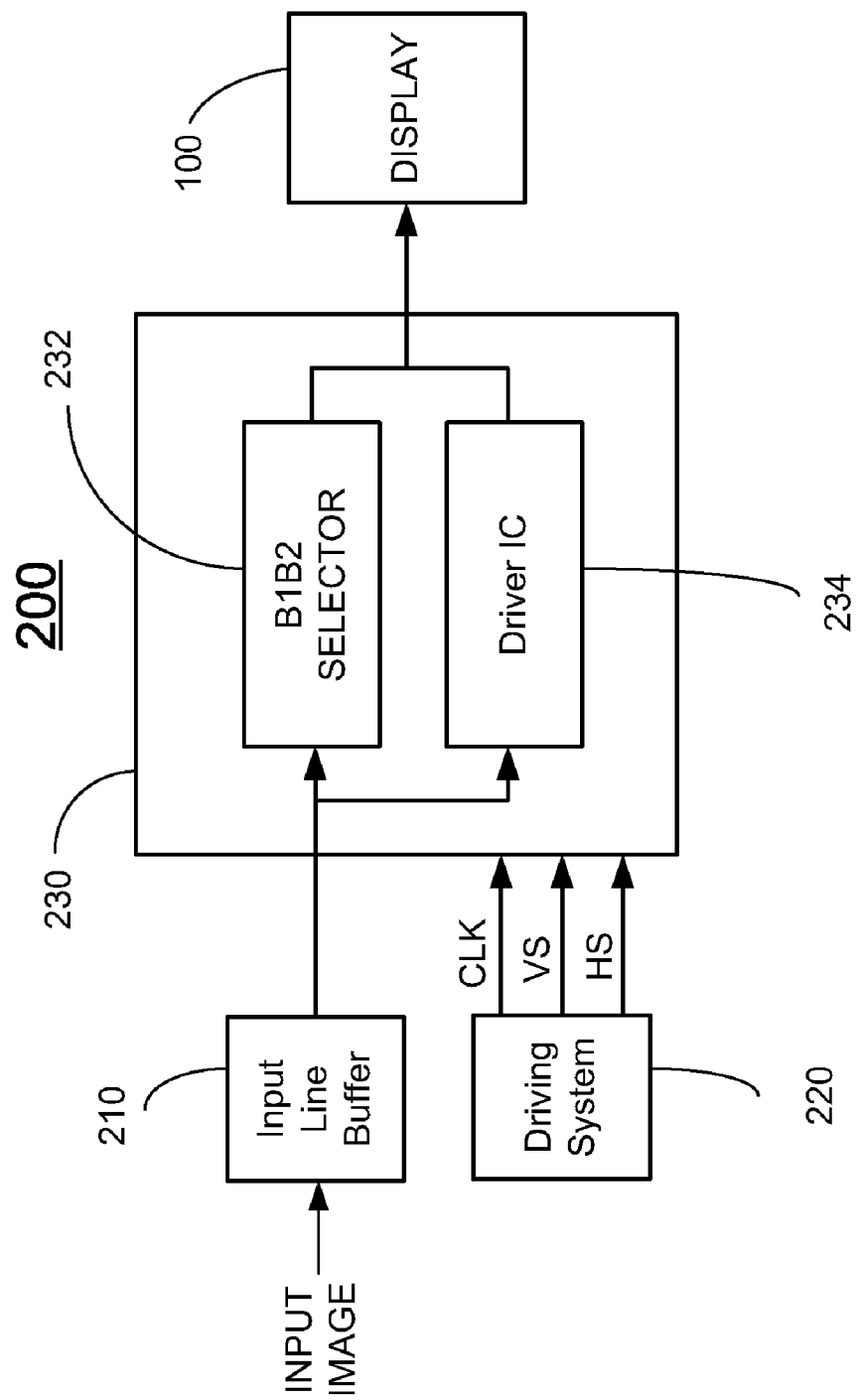
FIG. 2 shows a block diagram of a driver for an EL display device according to one embodiment of the present invention.

FIG. 2 schematically shows a block diagram of a system 200 of for driving an EL display device according to one embodiment of the present invention. The system 200 includes an image process (not shown) for processing an image to be displayed on the EL display panel 100 according to the pixel matrix of the EL display device 100, which is input to an input line buffer 210. The processed image has a plurality of pixel data signals. Each pixel data signal is associated with a respective pixel in the EL display panel 100 and includes a first sub-pixel data signal indicating an intensity level for the red light emitting element R of the respective pixel, a second sub-pixel data signal indicating an intensity level for the green light emitting element G of the respective pixel, a third sub-pixel data signal indicating an intensity level for the yellow-green light emitting element B1 of the respective pixel, and a fourth sub-pixel data signal indicating an intensity level for the blue light emitting element B2 of the respective pixel.

The processed image is then input to a data processor 230. The data processor 230 includes a selector 232 and a driver integrated circuit (IC) 234. The selector 232 then compares the third sub-pixel data signal and the fourth sub-pixel data signal of each pixel. If the third sub-pixel data signal is greater than or equal to the fourth sub-pixel data signal, the selector 232 assigns a logic value of 1 to the corresponding pixel.

Otherwise, the selector 232 assigns a logic value of 0 to the corresponding pixel. Then, the selector 232 counts the number of the logic value of 1, NB1, and the number of the logic value of 0, NB2, of each column of pixels.

If NB1≧NB2 for a respective column of pixels, the switching control signal for the respective column of pixels is configured to set the first switches 121 and the second switches 122 corresponding to the respective column of pixels in the ON state and the OFF state, respectively. If NB1<NB2 for the respective column of pixels, the first switches 121 and the second switches 122 corresponding to the respective column of pixels in the OFF state and the ON state, respectively.

The driver IC 234 converts, for each pixel, the first sub-pixel data signal to a first voltage to be applied to a corresponding first data line SRk, the second sub-pixel data signal to a second voltage to be applied to a corresponding second data line SGk, the third sub-pixel data signal if the corresponding pixel has a logic value of 1 or the fourth sub-pixel data signal if the corresponding pixel has a logic value of 0 to a third data voltage to be applied to a corresponding third data line SBk. In addition, the system 200 includes a driving system 220 that outputs a clock signal CLK, a vertical synchronizing signal VS, a horizontal synchronizing signal HS to the data processor 230, so that the plurality of pixel data signals of the image is driven to the EL display panel 100 sequentially in a row-by-row fashion controlled by the plurality of scanning signals.

Figure 3:
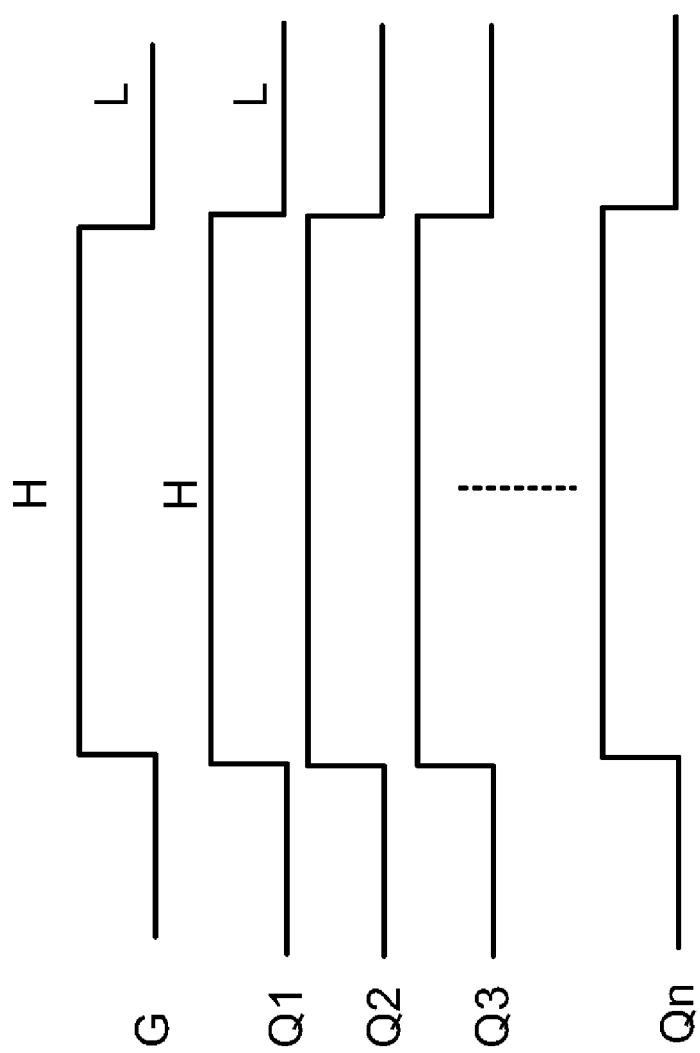
FIG. 3 shows schematically a time chart of a scanning signal G and a plurality of switching control signals Q1, Q2, . . . Qn for driving an EL display device according one embodiment of the present invention.

FIG. 3 shows schematically a time chart for a scanning signal G and a plurality of switching control signals, {Qk} (k=1, 2, 3, ..., N), for driving an EL display device according to one embodiment of the present invention. Each switching control signal Qk for a respective column of pixels is characterized with a waveform having a low voltage, L, and a high voltage, H, for controlling the first switches 121 and the second switches 122 corresponding to the respective column of pixels. The scanning signal G (a high voltage pulse) activates a corresponding row of pixels in the EL display panel 100 so that data signals are applied to the plurality of pixels in the corresponding rows.

Each switching control signal Qk determines whether the yellow-green light emitting elements B1 or the blue light emitting elements B2 of a corresponding pixel in the corresponding row of pixel receives a third sub-pixel data voltage. For example, in one embodiment, the first switches 121 and second switches 122 are configured such that when the switching control signal Qk for the respective column of pixels has the high voltage H, the first switches 121 and the second switches 122 corresponding to the respective column of pixels are set in the ON state and the OFF state, respectively. Therefore, the third sub-pixel data voltage is applied to the yellow-green light emitting elements B1. When the switching control signal for the respective column of pixels has the low voltage L, the first switches 121 and the second switches 122 corresponding to the respective column of pixels are set in the OFF state and the ON state, respectively. Accordingly, the third sub-pixel data voltage is applied to the blue light emitting elements B2.

Other configuration of the first switches 121 and the second switches 122 can also be utilized to practice the invention. For example, when the switching control signal Qk for the respective column of pixels has the low voltage L, the first switches 121 and the second switches 122 corresponding to the respective column of pixels are set in the ON state and the OFF state, respectively, whereby the third sub-pixel data voltage is applied to the yellow-green light emitting elements B1. When the switching control signal for the respective column of pixels has the high voltage H, the first switches 121 and the second switches 122 corresponding to the respective column of pixels are set in the OFF state and the ON state, respectively, whereby the third sub-pixel data voltage is applied to the blue light emitting elements B2.

Figure 4:
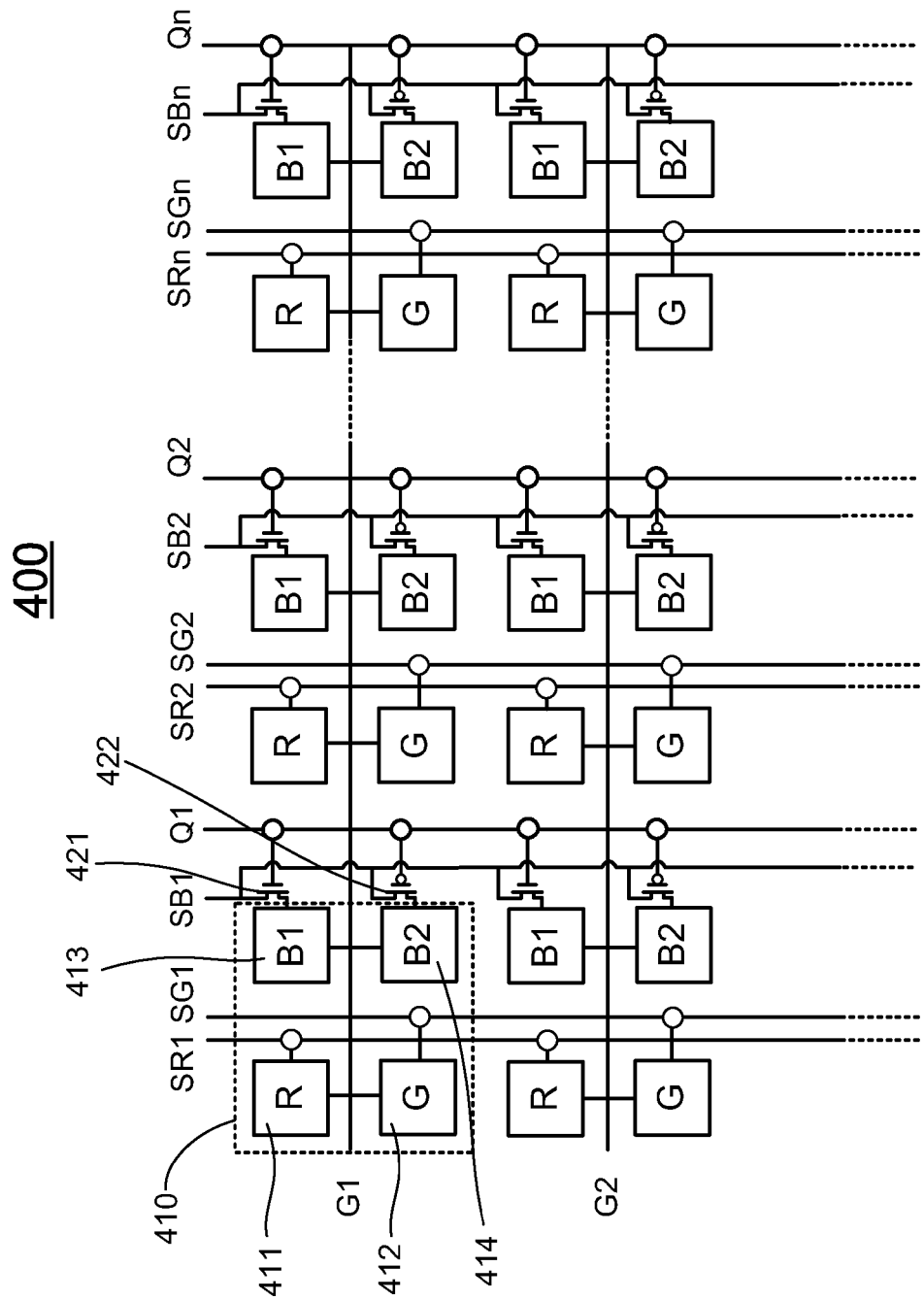
FIG. 4 shows schematically an EL display device according to one embodiment of the present invention.

The first switches 121 and the second switches 122 can be any types of two state switches, such as thin film transistors (TFTs), as shown in FIG. 4.

FIG. 4 shows schematically an EL display device 400 according to one embodiment of the present invention, where each of the plurality of first switches 421 is an N-type TFT, while each of the plurality of second switches 422 is a P-type TFT. The gate, source and drain of each N-type TFT 421 are respectively coupled to a corresponding switching control line Qk, a corresponding third data line SBk and the third EL element (B1) 413 of a corresponding pixel. The gate, source and drain of each P-type TFT 422 are respectively coupled to the corresponding switching control line Qk, the corresponding third data line SBk and the fourth EL element (B2) 414 of the corresponding pixel. For such an arrangement, when a switching control signal Qk for a respective column of pixels has the low voltage L, the N-type TFTs 421 of the respective column of pixels are turned on (in the ON state), while the P-type TFTs 422 of the respective column of pixels are turned off (in the OFF state). Accordingly, the third sub-pixel data signal provided from the respective third data line SBk is applied to the third EL elements (B1) 413 of the respective column of pixels. Otherwise, when the switching control signal Qk for the respective column of pixels has the high voltage H, the N-type TFTs 421 of the respective column of pixels are turned off (in the OFF state), while the P-type TFTs 422 of the respective column of pixels are turned on (in the ON state). Accordingly, the third sub-pixel data signal provided from the respective third data line SBk is applied to the fourth EL elements (B2) 414 of the respective column of pixels.

In an alternative embodiment, each of the plurality of first switches 421 is a P-type TFT, while each of the plurality of second switches 422 is an N-type TFT. In this example, when a switching control signal Qk for a respective column of pixels has the low voltage L, the N-type TFTs of the respective column of pixels are turned off (in the OFF state), while the P-type TFTs of the respective column of pixels are turned on (in the ON state). Accordingly, the third sub-pixel data signal provided from the respective third data line SBk is applied to the fourth EL elements (B2) of the respective column of pixels. When the switching control signal Qk for the respective column of pixels has the high voltage H, the N-type TFTs of the respective column of pixels are turned on (in the ON state), while the P-type TFTs of the respective column of pixels are turned off (in the OFF state). Accordingly, the third sub-pixel data signal provided from the respective third data line SBk is applied to the third EL elements (B1) of the respective column of pixels.

Accordingly, one aspect of the present invention provides a method of driving such an EL display device. The method includes the following steps. At first, an image to be displayed is processed according to the pixel matrix of the EL display device such that the processed image has a plurality of pixel data signals, each pixel data signal being associated with a respective pixel and having a first sub-pixel data signal, a second sub-pixel data signal, a third sub-pixel data signal and a fourth sub-pixel data signal indicating intensities for the first EL element, the second EL element, the third EL element and the fourth EL element, respectively, of the respective pixel. Then, the third sub-pixel data signal and the fourth sub-pixel data signal of each pixel are compared. A logic value of 1 is assigned to the corresponding pixel if the third sub-pixel data signal is greater than or equal to the fourth sub-pixel data signal, or a logic value of 0 assigned to the corresponding pixel if the third sub-pixel data signal is less than the fourth sub-pixel data signal. The number of the logic value of 1, NB1, and the number of the logic value of 0, NB2, of each column of pixels are counted subsequently. Next, the switching control signal for a respective column of pixels is configured to set the first switches and the second switches corresponding to the respective column of pixels in the ON state and the OFF state, respectively, if NB1≧NB2 for the respective column of pixels, and the first switches and the second switches in the OFF state and the ON state, respectively, if NB1<NB2 for the respective column of pixels.

While each of the EL display devices 100 and 400 shown in FIGS. 1 and 4, respectively, has fewer gate lines and data lines than a conventional EL display device, it still has 2×M×N switches that require N switching control signals/lines Qk (k=1, 2, 3, . . . N), where M and N are equal to the numbers of row and columns, respectively, of pixels. Therefore the electrical layout of the display devices is still relatively complicated and consequently results in higher cost.

Figure 5:
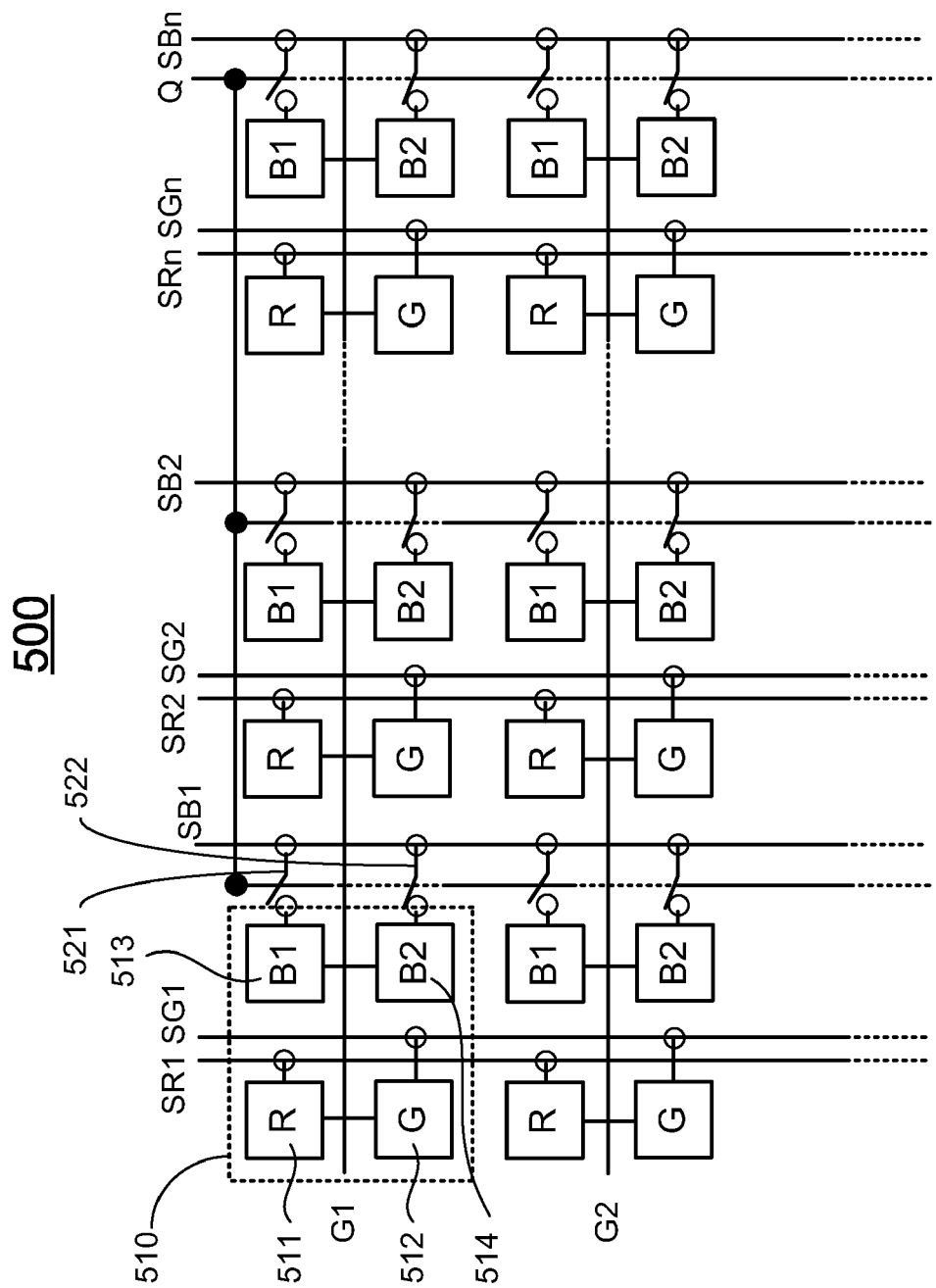
FIG. 5 shows schematically an EL display device according to another embodiment of the present invention.

FIG. 5 schematically shows an EL display device 500 according to another embodiment of the present invention in which the number of switching control signals/lines is reduced to one. Similar to the EL display device 100 shown in FIG. 1, the EL display device 500 has a plurality of pixels 510 spatially arranged in a form of a matrix with a plurality of rows and a plurality of columns. Each pixel 510 has a first EL element (R) 511 operably emitting light of a red color, a second EL element (G) 512 operably emitting light of a green color, a third EL element (B1) 513 operably emitting light of a yellow-green color, and a fourth EL element (B2) 514 operably emitting light of a blue color. The EL display device 500 is adapted for displaying an image. Operably, the image is processed by an image processor, according to the pixel matrix of the EL display device 500 such that the processed image has a plurality of pixel data signals, each pixel data signal being associated with a respective pixel and having a first sub-pixel data signal, a second sub-pixel data signal, a third sub-pixel data signal and a fourth sub-pixel data signal indicating intensities for the first EL element (R) 511, the second EL element (G) 511, the third EL element (B1) 513 and the fourth EL element (B2) 514, respectively, of the respective pixel.

The EL display device 500 also has a plurality of gate lines {Gj}, j=1, 2, 3, . . . M, M being the row number of the pixel matrix, a plurality of first data lines, {SRk}, k=1, 2, 3, . . . N, N being the column number of the pixel matrix, a plurality of second data lines, {SGk}, a plurality of third data lines, {SBk}, a plurality of first switches 521, a plurality of second switches 522, and a signal switch control line, Q.

Each gate line Gj is coupled to a respective row of pixels. Each first data line SRk is coupled to the first EL elements (R) 511 of a respective column of pixels. Each second data line SGk is coupled to the second EL elements (G) 512 of a respective column of pixels. Each third data line SBk is coupled, via the first switches 521 and the second switches 522, to the third EL elements (B1) 513 and the fourth EL elements (B2) 514 of a respective column of pixels.

Each first switch 521 is coupled to a respective third EL element (B1) 511, while each second switch 522 is coupled to a respective fourth EL element (B2) 512. The single switch control line Q is coupled to all of the first switches 521 and the second switches 522 for providing a switching control signal to set the first switches 521 and the second switches 522 to be in the ON state or the OFF state. In this exemplary embodiment, all of the first switches 511 are configured to be cooperatively in an ON state or an OFF state, while all of the second switches are configured to be cooperatively in the OFF state or the ON state.

Accordingly, when the first switches 521 are cooperatively in the ON state, the third sub-pixel data signal from a respective third data line SBk is provided to the third EL elements (B1) 513 of the respective column of pixels, and when the second switches 522 are cooperatively in the ON state, the third sub-pixel data signal from the respective third data line SBk is provided to the fourth EL elements (B2) 514 of the respective column of pixels.

To determine which switches are turned on or off, a selector is adapted and configured to compare the third sub-pixel data signal and the fourth sub-pixel data signal of each pixel, to assign a logic value of 1 to the corresponding pixel if the third sub-pixel data signal is greater than or equal to the fourth sub-pixel data signal, or a logic value of 0 to the corresponding pixel if the third sub-pixel data signal is less than the fourth sub-pixel data signal, and to count the number of the logic value of 1, NB1, and the number of the logic value of 0, NB2, of the plurality of pixels. If NB1≧NB2, the switching control signal Q is configured to set the first switches 521 in the ON state and the second switches 522 in the OFF state, respectively. Otherwise, if NB1<NB2, the switching control signal Q is configured to the first switches 521 in the OFF state and the second switches 522 in the ON state, respectively, if NB1<NB2.

Figure 6:
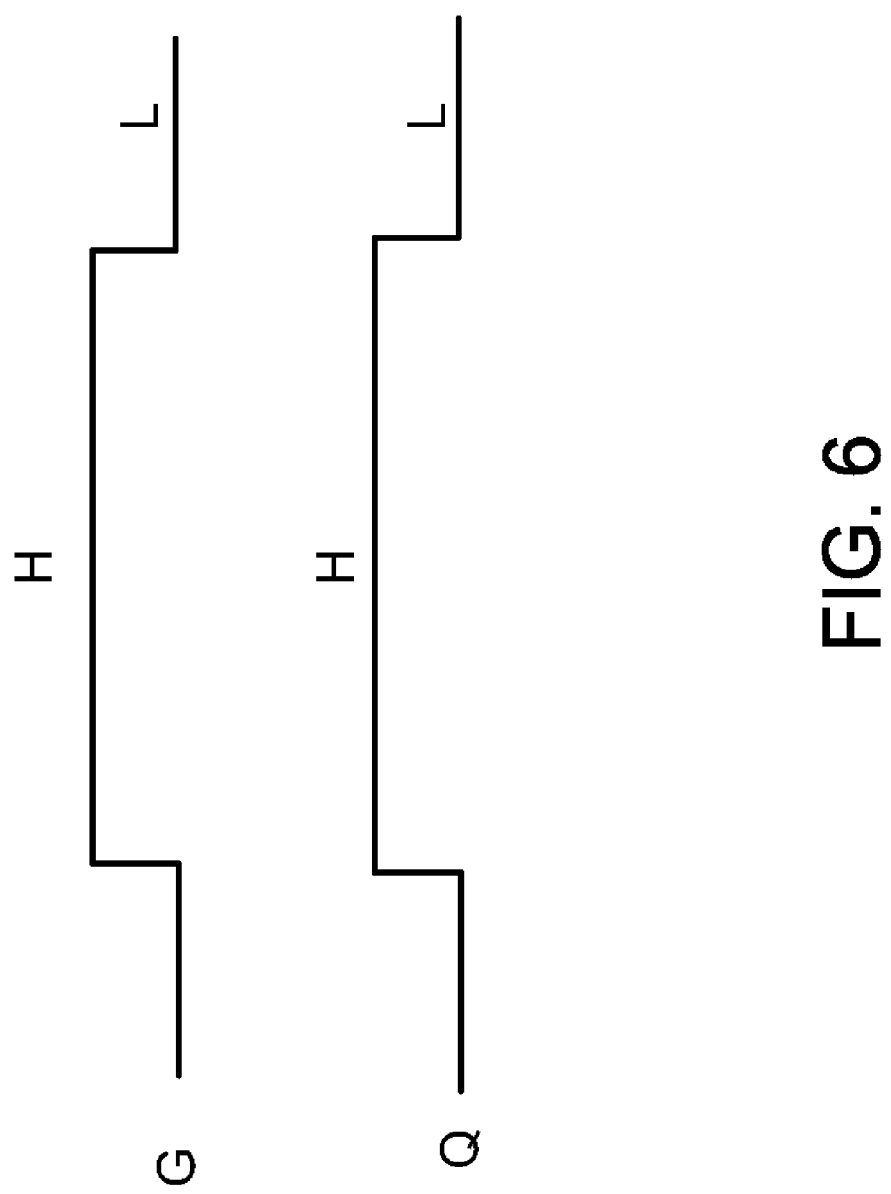
FIG. 6 shows schematically a time chart of a scanning signal G and a single switching control signal Q for driving an EL display device according to one embodiment of the present invention.

In one embodiment, the switching control signal Q is characterized with a waveform having a low voltage, L, and a high voltage, H, for controlling the first switches 521 and the second switches 522, as shown in FIG. 6. For example, when the switching control signal Q has the low voltage L, the first switches 521 and the second switches 522 are set in the ON state and the OFF state, respectively, and when the switching control signal Q has the high voltage H, the first switches 521 and the second switches 522 are set in the OFF state and the ON state, respectively. Now, instead of N switching control signals, the single switching control signal Q controls whether each third data line SBk is coupled to the third light emitting element (B1) 513 or to the fourth light emitting element (B2) 514 of a respective pixel.

Figure 7:
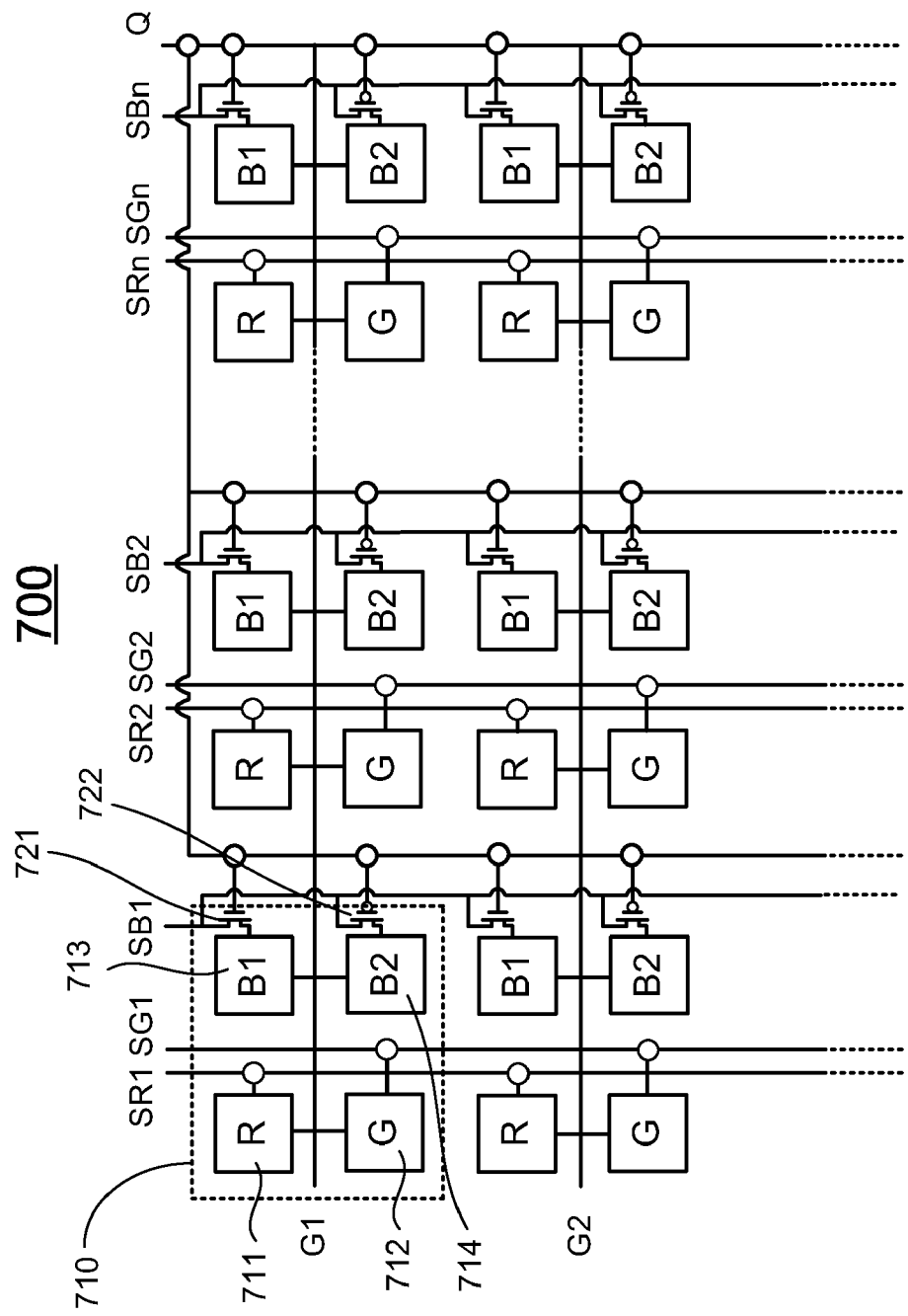
FIG. 7 shows schematically an EL display device according to one embodiment of the present invention.
Figure 8:
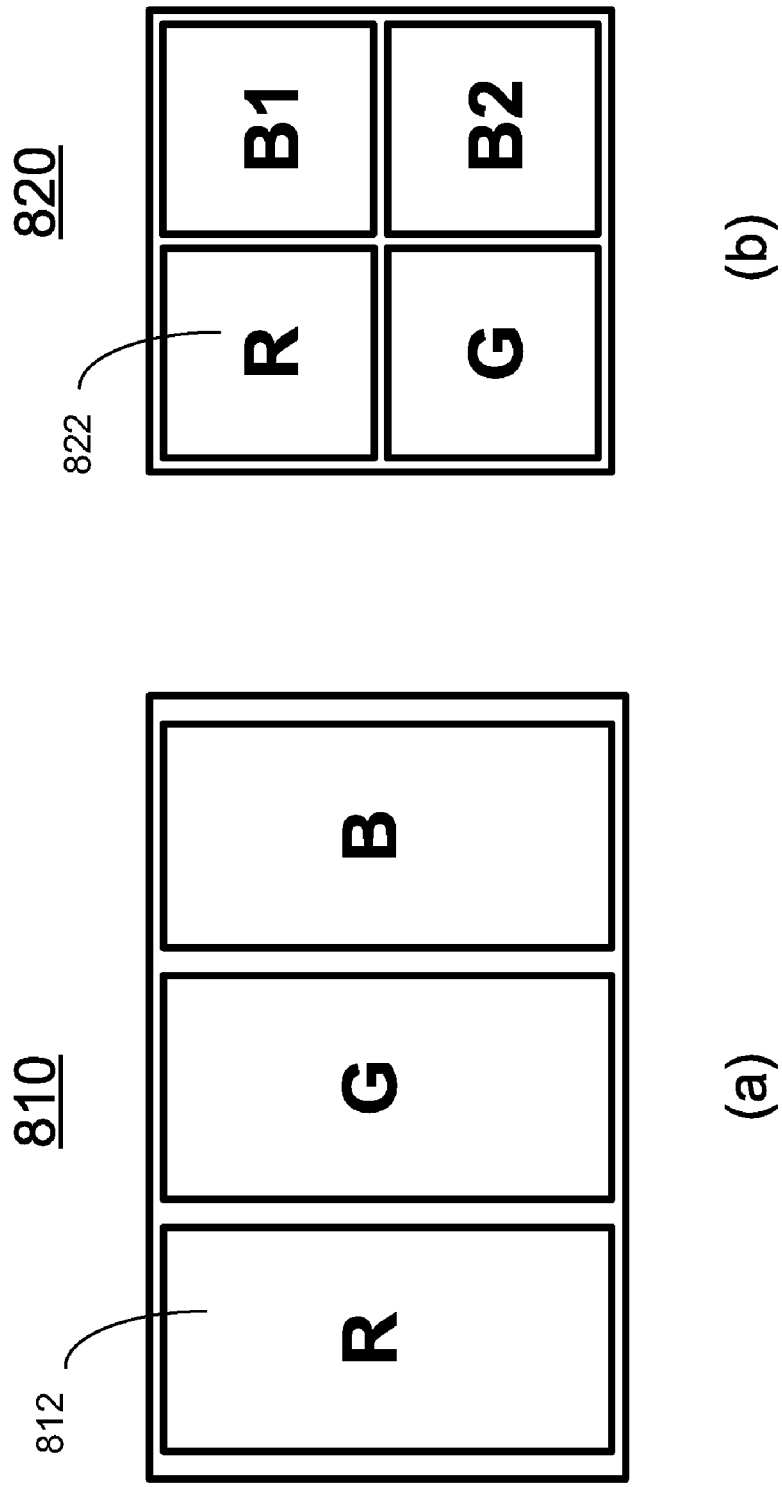
FIG. 8 shows schematically two pixel arrangements (a) and (b) for a conventional EL display device.

FIG. 7 shows schematically an EL display panel 700 according to one embodiment of the present invention. The display panel 700 has a similar layout as that of the display panel 500. However, each first switch 721 includes an N-type TFT, while each second switch 722 includes a P-type TFT. The gate, source and drain of each N-type TFT are respectively coupled to the switching control line Q, a corresponding third data line SBk and the third EL element (B1) 713 of a corresponding pixel. The gate, source and drain of each P-type TFT are respectively coupled to the switching control line Q, the corresponding third data line SBk and the fourth EL element (B2) 714 of the corresponding pixel. For such an arrangement, when the switching control signal Q has the high voltage H, all of the first switches 721 are turned off and all of the second switches 722 are turned on. Accordingly, a third sub-pixel data signal is input to the fourth light emitting element (B2) 714 of a respective column of pixels. When the switching control signal Q has the low voltage L, all of the first switches 721 are turned on and all of the second switches 722 are turned off. Accordingly, a third sub-pixel data signal is input to the third light emitting element (B1) 713 of the respective column of pixels.

In an alternative embodiment, each first switch 721 is a P-type TFT and each second switch 722 is an N-type TFT.

Furthermore, another aspect of the present invention provides a method of driving such an EL display device 500 (or 700). The method includes the following steps. At first, an image to be displayed is processed according to the pixel matrix of the EL display device. The processed image has a plurality of pixel data signals, each pixel data signal being associated with a respective pixel and having a first sub-pixel data signal, a second sub-pixel data signal, a third sub-pixel data signal and a fourth sub-pixel data signal indicating intensities for the first EL element, the second EL element, the third EL element and the fourth EL element, respectively, of the respective pixel.

Next, the third sub-pixel data signal and the fourth sub-pixel data signal of each pixel are compared. A logic value of 1 is assigned to the corresponding pixel if the third sub-pixel data signal is greater than or equal to the fourth sub-pixel data signal, or a logic value of 0 is assigned to the corresponding pixel if the third sub-pixel data signal is less than the fourth sub-pixel data signal. The number of the logic value of 1, NB1, and the number of the logic value of 0, NB2, of the plurality of pixels are counted.

Then, the switching control signal is configured to set the plurality of first switches 721 in the ON state and the plurality of second switches 722 in the OFF state, respectively, if NB1≧NB2, and the plurality of first switches 721 in the OFF state and the plurality of second switches 722 in the ON state, respectively, if NB1<NB2.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electroluminescent (EL) display device, comprising:
   a. a plurality of pixels spatially arranged in a form of a matrix with a plurality of rows and a plurality of columns, each pixel comprising a first EL element operably emitting light of a first color, a second EL element operably emitting light of a second color, a third EL element operably emitting light of a third color, and a fourth EL element operably emitting light of a fourth color;
   b. a plurality of gate lines, each gate line coupled to the respective matrix of pixels;
   c. a plurality of first data lines, each first data line coupled to the first EL elements of a respective column of pixels;
   d. a plurality of second data lines, each second data line coupled to the second EL elements of a respective column of pixels;
   e. a plurality of first switches, each first switch coupled to a respective third EL element, wherein the first switches coupled to the third EL elements of a respective column of pixels are configured to be cooperatively in an ON state or an OFF state;
   f. a plurality of second switches, each second switch coupled to a respective fourth EL element, wherein the second switches coupled to the fourth EL elements of a respective column of pixels are configured to be cooperatively in an ON state or an OFF state;
   g. a plurality of switch control lines, each switch control line coupled to the first switches and the second switches corresponding to a respective column of pixels for transmitting a switching control signal to set the first switches and the second switches to be in the ON state or the OFF state, such that when the first switches are cooperatively in the ON state, the second switches are cooperatively in the OFF state, and vice versus; and
   h. a plurality of third data lines, each third data line coupled to the first switches and the second switches corresponding to a respective column of pixels for transmitting a data signal, such that when the first switches are cooperatively in the ON state, the data signal is provided to the third EL elements of the respective column of pixels, and when the second switches are cooperatively in the ON state, the data signal is provided to the fourth EL elements of the respective column of pixels.

2. The EL display device of claim 1, further comprising:
   i. an image processor for processing an image to be displayed according to the pixel matrix of the EL display device such that the processed image has a plurality of pixel data signals, each pixel data signal being associated with a respective pixel and having a first sub-pixel data signal, a second sub-pixel data signal, a third sub-pixel data signal and a fourth sub-pixel data signal indicating intensities for the first EL element, the second EL element, the third EL element and the fourth EL element, respectively, of the respective pixel; and
   ii. a selector configured to compare the third sub-pixel data signal and the fourth sub-pixel data signal of each pixel, to assign a logic value of 1 to the corresponding pixel if the third sub-pixel data signal is greater than or equal to the fourth sub-pixel data signal, or a logic value of 0 to the corresponding pixel if the third sub-pixel data signal is less than the fourth sub-pixel data signal, and to count the number of the logic value of 1, NB1, and the number of the logic value of 0, NB2, of each column of pixels.

3. The EL display device of claim 2, wherein the switching control signal for a respective column of pixels is configured to set the first switches and the second switches corresponding to the respective column of pixels in the ON state and the OFF state, respectively, if NB1≧NB2 for the respective column of pixels, and the first switches and the second switches corresponding to the respective column of pixels in the OFF state and the ON state, respectively, if NB1<NB2 for the respective column of pixels.

4. The EL display device of claim 3, wherein the switching control signal for a respective column of pixels is characterized with a waveform having a low voltage and a high voltage.

5. The EL display device of claim 4, wherein when the switching control signal for the respective column of pixels has one of the low voltage and the high voltage, the first switches and the second switches corresponding to the respective column of pixels are set in the ON state and the OFF state, respectively, and when the switching control signal for the respective column of pixels has the other of the low voltage and the high voltage, the first switches and the second switches corresponding to the respective column of pixels are set in the OFF state and the ON state, respectively.

6. The EL display device of claim 1, wherein each of the plurality of first switches comprises one of an N-type thin film transistor (TFT) and a P-type TFT, and each of the plurality of second switches comprises the other of the N-type TFT and the P-type TFT, wherein each of the N-type TFT and the P-type TFT has a gate, a source and a drain.

7. The EL display device of claim 6, wherein the gate, source and drain of each N-type TFT are respectively coupled to a corresponding switching control line, a corresponding third data line and one of the third EL element and the fourth EL element of a corresponding pixel, and the gate, source and drain of each P-type TFT are respectively coupled to the corresponding switching control line, the corresponding third data line and the other of the third EL element and the fourth EL element of the corresponding pixel.

8. The EL display device of claim 1, wherein the first color is a red color, the second color is a green color, the third color is a blue color and the fourth color is a yellow-green color.

9. The EL display device of claim 1, wherein the first EL element, the second EL element, the third EL element and the fourth EL element of each pixel are spatially arranged as a 2×2 sub-array.

10. A method of driving the EL display device of claim 1, comprising the steps of:
  i. processing an image to be displayed according to the pixel matrix of the EL display device such that the processed image has a plurality of pixel data signals, each pixel data signal being associated with a respective pixel and having a first sub-pixel data signal, a second sub-pixel data signal, a third sub-pixel data signal and a fourth sub-pixel data signal indicating intensities for the first EL element, the second EL element, the third EL element and the fourth EL element, respectively, of the respective pixel;
  ii. comparing the third sub-pixel data signal and the fourth sub-pixel data signal of each pixel;
  iii. assigning a logic value of 1 to the corresponding pixel if the third sub-pixel data signal is greater than or equal to the fourth sub-pixel data signal, or a logic value of 0 to the corresponding pixel if the third sub-pixel data signal is less than the fourth sub-pixel data signal;
  iv. counting the number of the logic value of 1, NB1, and the number of the logic value of 0, NB2, of each column of pixels; and
  v. configuring the switching control signal for a respective column of pixels so as to set the first switches and the second switches corresponding to the respective column of pixels in the ON state and the OFF state, respectively, if $NB1 \geq NB2$ for the respective column of pixels, and the first switches and the second switches in the OFF state and the ON state, respectively, if $NB1 < NB2$ for the respective column of pixels.

11. An electroluminescent (EL) display device, comprising:
  a. a plurality of pixels spatially arranged in a form of a matrix with a plurality of rows and a plurality of columns, each pixel comprising a first EL element operably emitting light of a first color, a second EL element operably emitting light of a second color, a third EL element operably emitting light of a third color, and a fourth EL element operably emitting light of a fourth color;
  b. a plurality of gate lines, each gate line coupled to a respective row of pixels;
  c. a plurality of first data lines, each first data line coupled to the first EL elements of a respective column of pixels;
  d. a plurality of second data lines, each second data line coupled to the second EL elements of a respective column of pixels;
  e. a plurality of first switches, each first switch coupled to a respective third EL element, wherein the plurality of first switches are configured to be cooperatively in an ON state or an OFF state;
  f. a plurality of second switches, each second switch coupled to a respective fourth EL element, wherein the plurality of second switches are configured to be cooperatively in an ON state or an OFF state;
  g. a switch control line coupled to the plurality of first switches and the plurality of second switches for providing a switching control signal to set the first switches and the second switches to be in the ON state or the OFF state, such that when the plurality of first switches are cooperatively in the ON state, the plurality of second switches are cooperatively in the OFF state, and vice versus; and
  h. a plurality of third data lines, each third data line coupled to the first switches and the second switches corresponding to a respective column of pixels for transmitting a data signal, such that when the first switches are cooperatively in the ON state, the data signal is provided to the third EL elements of the respective column of pixels, and when the second switches are cooperatively in the ON state, the data signal is provided to the fourth EL elements of the respective column of pixels.

12. The EL display device of claim 11, further comprising:
  i. an image processor for processing an image to be displayed according to the pixel matrix of the EL display device such that the processed image has a plurality of pixel data signals, each pixel data signal being associated with a respective pixel and having a first sub-pixel data signal, a second sub-pixel data signal, a third sub-pixel data signal and a fourth sub-pixel data signal indicating intensities for the first EL element, the second EL element, the third EL element and the fourth EL element, respectively, of the respective pixel; and
  ii. a selector configured to compare the third sub-pixel data signal and the fourth sub-pixel data signal of each pixel, to assign a logic value of 1 to the corresponding pixel if the third sub-pixel data signal is greater than or equal to the fourth sub-pixel data signal, or a logic value of 0 to the corresponding pixel if the third sub-pixel data signal is less than the fourth sub-pixel data signal, and to count the number of the logic value of 1, NB1, and the number of the logic value of 0, NB2, of the plurality of pixels.

13. The EL display device of claim 11, wherein the switching control signal is configured to set the plurality of first switches in the ON state and the plurality of second switches in the OFF state, respectively, if $NB1 \geq NB2$, and the plurality of first switches in the OFF state and the plurality of second switches in the ON state, respectively, if $NB1 < NB2$.

14. The EL display device of claim 13, wherein the switching control signal is characterized with a waveform having a low voltage and a high voltage.

15. The EL display device of claim 14, wherein when the switching control signal has one of the low voltage and the high voltage, the plurality of first switches and the plurality of second switches are set in the ON state and the OFF state, respectively, and when the switching control signal has the other of the low voltage and the high voltage, the plurality of first switches and the plurality of second switches are set in the OFF state and the ON state, respectively.

16. The EL display device of claim 11, wherein each of the plurality of first switches comprises one of an N-type thin film transistor (TFT) and a P-type TFT, and each of the plurality of second switches comprises the other of the N-type TFT and the P-type TFT, wherein each of the N-type TFT and the P-type TFT has a gate, a source and a drain.

17. The EL display device of claim 16, wherein the gate, source and drain of each N-type TFT are respectively coupled to the switching control line, a corresponding third data line and one of the third EL element and the fourth EL element of a corresponding pixel, and the gate, source and drain of each P-type TFT are respectively coupled to the switching control line, the corresponding third data line and the other of the third EL element and the fourth EL element of the corresponding pixel.

18. The EL display device of claim 11, wherein the first color is a red color, the second color is a green color, the third color is a blue color and the fourth color is a yellow-green color.

19. The EL display device of claim 11, wherein the first EL element, the second EL element, the third EL element and the fourth EL element of each pixel are spatially arranged as a 2×2 sub-array.

20. A method of driving the EL display device of claim 11, comprising the steps of:
  i. processing an image to be displayed according to the pixel matrix of the EL display device such that the processed image has a plurality of pixel data signals, each pixel data signal being associated with a respective pixel and having a first sub-pixel data signal, a second sub-pixel data signal, a third sub-pixel data signal and a fourth sub-pixel data signal indicating intensities for the first EL element, the second EL element, the third EL element and the fourth EL element, respectively, of the respective pixel;
  ii. comparing the third sub-pixel data signal and the fourth sub-pixel data signal of each pixel;
  iii. assigning a logic value of 1 to the corresponding pixel if the third sub-pixel data signal is greater than or equal to the fourth sub-pixel data signal, or a logic value of 0 to the corresponding pixel if the third sub-pixel data signal is less than the fourth sub-pixel data signal;
  iv. counting the number of the logic value of 1, NB1, and the number of the logic value of 0, NB2, of the plurality of pixels; and
  v. configuring the switching control signal so as to set the plurality of first switches in the ON state and the plurality of second switches in the OFF state, respectively, if NB1≧NB2, and the plurality of first switches in the OFF state and the plurality of second switches in the ON state, respectively, if NB1<NB2.

* * * * *